United States Patent
Lee et al.

(10) Patent No.: US 7,088,180 B2
(45) Date of Patent: Aug. 8, 2006

(54) PROGRAMMABLE GAIN CURRENT AMPLIFIER

(75) Inventors: Yi-Bin Lee, Hsinchu (TW); Peng-Un Su, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 74 days.

(21) Appl. No.: 11/030,026

(22) Filed: Jan. 5, 2005

(65) Prior Publication Data

US 2006/0103463 A1    May 18, 2006

(30) Foreign Application Priority Data

Nov. 16, 2004   (TW) ............................... 93135088 A

(51) Int. Cl.
*H03F 3/45* (2006.01)

(52) U.S. Cl. ...................................... 330/254; 330/257
(58) Field of Classification Search ................. 330/257
See application file for complete search history.

(56) References Cited

U.S. PATENT DOCUMENTS

| 4,361,815 | A |   | 11/1982 | Schade, Jr. |
| 5,565,815 | A |   | 10/1996 | Klein |
| 6,028,484 | A | * | 2/2000 | Cole et al. ................... 330/295 |
| 6,121,830 | A |   | 9/2000 | Manninen |
| 6,175,278 | B1 |   | 1/2001 | Hasegawa |
| 6,538,632 | B1 | * | 3/2003 | Yamazaki et al. ............ 345/98 |
| 6,864,748 | B1 | * | 3/2005 | Richardson ................. 330/288 |

* cited by examiner

*Primary Examiner*—Robert Pascal
*Assistant Examiner*—Alan Wong
(74) *Attorney, Agent, or Firm*—Apex Juris, pllc; Tracy M. Heims

(57) ABSTRACT

A programmable gain current amplifier is provided, including a transistor pair, a plurality of differential pairs, and a control device. The transistor pair receives an input current. Each differential pairs connecting with each other in parallel is connected to the transistor pair to form a differential current mirror for amplifying the input current. The control device adjusts the output polarity of the current mirror, thereby obtaining a predetermined gain between the output of the current mirror and the input current. Therefore, amplification of the input current at a programmable gain is realized.

14 Claims, 3 Drawing Sheets

PROGRAMMABLE GAIN CURRENT AMPLIFIER

BACKGROUND

1. Field of the Invention

The invention relates to a current amplifier and, in particular, to a programmable gain current amplifier with a fixed bias current.

2. Description of the Related Art

In a wireless communication system, the programmable gain amplifier is used to adjust the magnitude of the output signal and thus satisfy the system requirements. Therefore, the programmable gain amplifier is an extremely important element in wireless communications.

A typical programmable gain amplifier in integrated circuit is realized using an operational amplifier with the programmable resistive feedback. However, to obtain different and accurate gains, they have to be implemented using several sets of accurate resistors. As a result, the structure occupies large chip area. Moreover, the operational amplifier in broadband communication systems consumes more power. Such a structure is not suitable for broadband communication systems, such as the WLAN system.

The current amplifier is a good topology to save the chip area and meet the wide bandwidth requirement. However, the bias current would be different with different gain setting in the current amplifier, which may affect the performance of the next stage circuit. Some work has been done to solve this problem. As disclosed in the U.S. Pat. No. 4,361,815, a differential input signal is amplified by two current amplifiers with predetermined gains and uses a current mirror to convert the signal into a single-ended output. The common mode signal will thus be cancelled. However, process variations may let the gains of the two current amplifiers different. In this case, the common mode signal cannot be completely cancelled. Moreover, since the amplifier has a single-ended output, it is more sensitive to noise.

The current amplifier, as disclosed in the U.S. Pat. No. 5,565,815, amplifies the differential input signals using NMOS and PMOS current mirrors with the same gain, the connection of each other is in such way to cancel the common mode signal. Similar with the previous work, if the gains of the NMOS and PMOS current mirrors are different, the common mode signal cannot be completely cancelled.

The current amplifier provided in the U.S. Pat. No. 6,121,830 converts differential voltage input signal into differential current signal, extracts and removes their common mode signal, adds on a bias current proportional to the inverse of the current amplifier gain, amplifies with a current amplifier, and finally converts the current signal into a voltage signal output. The structure obtains a more stable bias current output using the inverse operations of the bias current and the current amplifier. However, the circuit structure is more complicated.

The current amplifier provided in the U.S. Pat. No. 6,175,278 B1 first converts the voltage input signal into current signal. After that, a current amplifier amplifies the signal, which is then converted into a voltage output signal using a resistive loading. In this structure, a voltage adjusting circuit is used to compare the bias voltage of the output terminal with a reference voltage. The output of the voltage adjusting circuit is then used to control the bias current of the current amplifier. Thus, the output terminal has a stable bias voltage close to the reference voltage. In this design, the convergent time, stability, and accuracy of the voltage adjusting mechanism have to be carefully considered. Besides, the circuit has to adjust the voltage when the gain of the amplifier changes.

SUMMARY

In view of the foregoing, an objective of the invention is to provide a programmable gain current amplifier which changes the current mirror ratio to induce the programmable gain, thereby solving many limitations and drawbacks existing in the prior art.

The programmable gain current amplifier according to the present invention generates different current mirror ratios under a fixed DC current output by adjusting the output polarities of various sets of differential current mirrors, thus rendering different current gains.

An objective of the invention is to provide a programmable gain current amplifier, which has a plurality of differential current mirrors. The bias currents of each of the differential current mirrors remain fixed. Thus, the bias current of the whole structure can be kept fixed.

Another objective of the invention is to provide a programmable gain current amplifier, which outputs a fixed bias current under the requirements of chip area and bandwidth.

A further objective of the invention is to provide a programmable gain current amplifier, which generates a bias current whose the stability is not affected by the process variation.

Yet another objective of the invention is to provide a programmable gain current amplifier whose structure is simpler.

To achieve the above objective, the disclosed programmable gain current amplifier includes a transistor pair, a plurality of differential pairs, and a control device. The transistor pair forms a differential current mirror with each of the differential pairs. The differential pairs are connected in parallel. After the transistor pair receives an input current, the input current is mirrored to each of the differential pairs. In this case, the input current is amplified according to the mirror ratio of each differential current mirror. The output polarity of each differential current mirror is controlled by a control device, rendering a predetermined gain relation between the output sum of the differential current mirrors and the input current. Therefore, amplification of the input current at a programmable gain is realized.

The mirror ratio of the differential current mirror is determined according to a predetermined programmable gain range and a predetermined gain step. In other words, a transistor pair with an appropriate size and differential pairs with appropriate sizes are selected according to the predetermined programmable gain range and the predetermined gain step.

Further, the disclosed programmable gain current amplifier further includes an input stage to convert an input voltage into an input current, which is provided to the transistor pair.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

Figure 1:
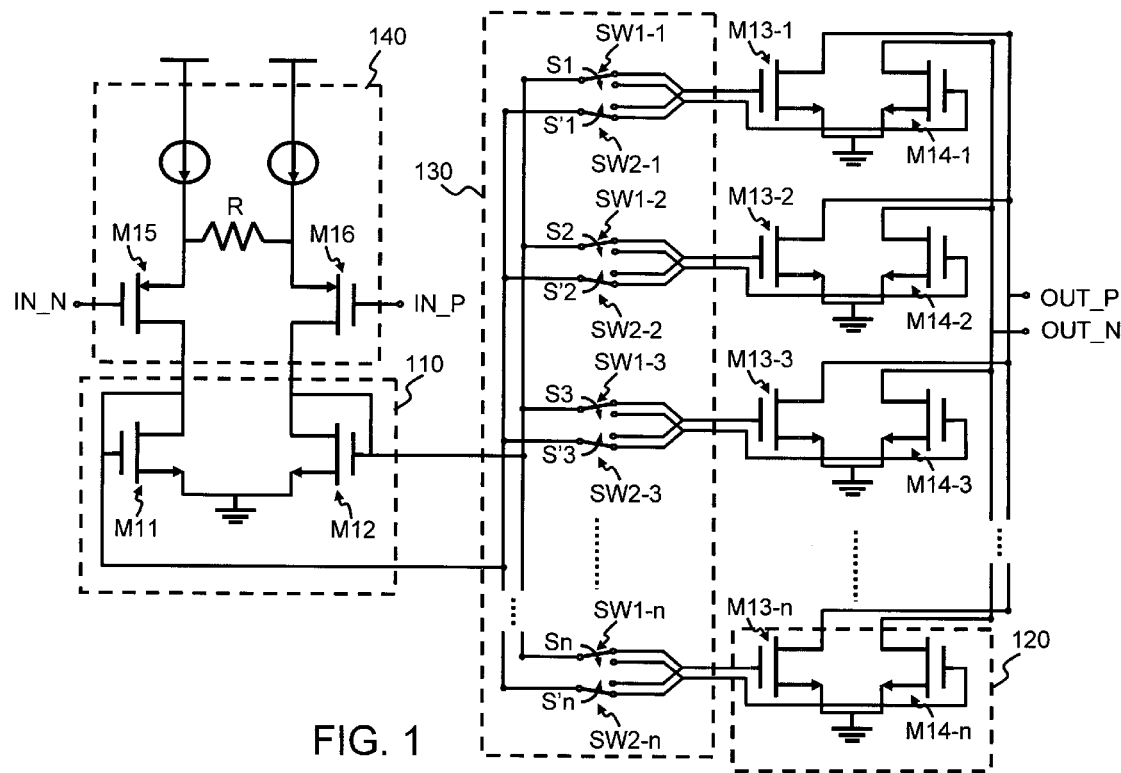
FIG. 1 is a schematic block diagram of a programmable gain current amplifier according to an embodiment of the invention.

FIG. 1 shows an embodiment of the disclosed programmable gain current amplifier. In this embodiment, the programmable gain current amplifier includes: a transistor pair 110 for receiving an input current; a plurality of differential pairs 120 connected in parallel, each of which and the transistor pair 110 form a differential current mirror to amplify the input current; and a control device 130 for controlling the output polarity of the differential current mirror, rendering a predetermined gain between the output of the differential current mirrors and the input current.

The transistor pair 110 includes a first transistor M11 and a second transistor M12, which are about the same in size. The two transistors M11, M12 are two diode-connected transistors. In this embodiment, the first and second transistors M11, M12 are two same-type metal oxide semiconductor field effect transistors (MOSFET) about the same in size. The sources of the two transistors M11, M12 are connected. The gates of the transistors M11, M12 are connected to the associated drains. In addition, the two transistors M11, M12 can be two same-type bipolar junction transistors (BJT) or any two transistors with the same function as the above-mentioned ones.

The differential pair 120 is a pseudo differential pair, including third transistors M13 (M13-1~M13-n) and fourth transistors M14 (M14-1~M14-n). The transistors M13, M14 are about the same in size. In this embodiment, the transistors M13, M14 can be two same-type MOSFET of about the same size. The sources of the transistors M13, M14 are connected together. The types of the third and fourth transistors M13, M14 are the same as the first and second transistors M11, M12. That is, the first to the fourth transistors M11~M14 can all be PMOS or NMOS. Moreover, the two transistors M13, M14 can also be two same-type BJT or any two transistors with the same function as the above-mentioned ones.

The input terminal of the transistor pair 110 is connected to the input terminal of each differential pair 120 via the control device 130, and the transistor pair 110 and each differential pair 120 form a common source structure. That is, the input terminals of the two diode-connected transistors are connected electrically to the input terminal of each pseudo differential pair, and the sources of the diode-connected transistors are connected to the sources of the pseudo differential pairs.

In this embodiment, the control device 130 contains a plurality of first switches SW1 (SW1-1~SW1-n) and a plurality of second switches SW2 (SW2-1~SW2-n). Each of the first and second switches SW1, SW2 combines with the corresponding differential pair 120 to form a variable polarity pseudo differential pair. The two switches SW1, SW2 switch according to control signals S (S1~Sn), S' (S'1~S'n), which are complements of each other to control the polarities of the amplified current signals. That is, the control signals S, S' are used to determine the output polarities of the differential current mirrors. In this case, the switches SW1, SW2 can be SPDT switches and connected between the input terminal of the transistor pair 110 and the input terminal of the differential pair 120. That is, the terminals of the first and second switches SW1, SW2 are connected respectively to the gates of the first and second transistors M11, M12, and the other terminals are selectively connected to the gates of the third and fourth transistors M13, M14. The control signals S, S' are a set of complementary logic numbers (i.e., "logic 0" and "logic 1"). If the control signal S is "logic 1", then the control signal S' is "logic 0." In this case, the first switch SW1 is connected to the gate of the third transistor M13, and the second switch SW2 is connected to the gate of the fourth transistor M14. On the other hand, if the control signal S is "logic 0", then the control signal S' is "logic 1". In this case, the first switch SW1 is connected to the gate of the fourth transistor M14, and the second switch SW2 is connected to the gate of the third transistor M13.

Moreover, the programmable gain current amplifier further includes an input stage 140 to convert the input voltage signal into an input current signal of the transistor pair 110. The input stage 140 can be implemented by a differential pair with resistive degeneration. In this case, the input stage 140 includes a fifth transistor M15 and a sixth transistor M16; a set of bias current sources 142, 144; and a resistor R. The bias current sources 142, 144 are connected to the sources of the fifth and sixth transistors M15, M16. The resistor R is connected between the sources of the fifth and sixth transistors M15, M16. The gates of the fifth and sixth transistors M15, M16 are connected to two input terminals IN_P, IN_N to receive an input voltage. The converted input current is supplied from the drains of the fifth and sixth transistors M15, M16 to the transistor pair 110.

The fifth and sixth transistors M15, M16 are two same-type MOSFET, two same-type BJT or any two transistors with the same functions as the above-mentioned ones. However, the type of the fifth and sixth transistors M15, M16 is opposite to that of the first and second transistors M11, M12. That is, when the first and second transistors M11, M12 are PMOS, the fifth and sixth transistors M15, M16 are NMOS, and vice versa.

The input current is mirrored to each of the differential pairs 120 via the transistor pair 110. That is, since there is a predetermine mirror ratio between the transistor pair 110 and each of the differential pair 120, the input current is amplified according to the predetermined mirror ratios. The control device 130 is used to select the output polarity of each of the differential current mirrors to generate each of the predetermined gain. The control device 130 switches the output polarity of each of the differential current mirrors, amounting to a predetermined gain between the output of the current mirror and the input current.

Therefore, one can select an appropriate number of differential pairs and the sizes of the transistor pair and differential pairs to produce desired programmable gain range and gain step. In other words, an appropriate transistor pair and differential pairs are selected according to the desired programmable gain range and gain step.

Figure 2:
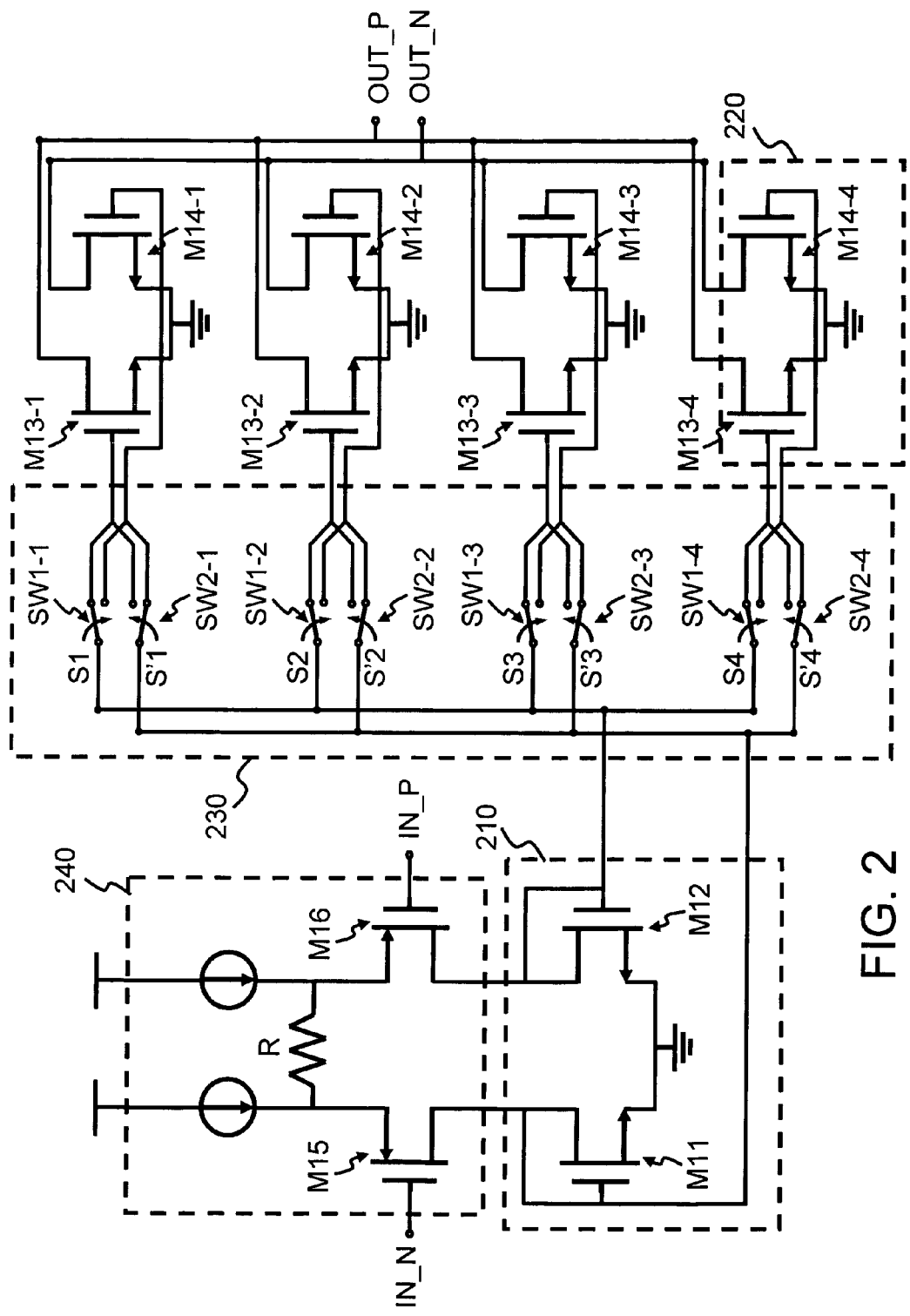
FIG. 2 is a schematic block diagram of a programmable gain current amplifier according to another embodiment of the invention.

For example, if one wants to design an amplifier with a programmable gain range of 12 dB and a gain step of 3 dB, the amplifier has to have five states, whose current mirror ratios are 40:28:20:14:10. This can be realized by using four sets of differential current mirrors, which are formed by a diode-connected transistor pair 210 and four sets of pseudo differential pairs 220. The first to fourth transistors M11, M12, M13-1~M13-4, M14-1~M14-4 in the diode-connected transistor pair 210 and the pseudo differential pairs 220 are NMOS, while the fifth and sixth transistors M15, M16 in an input stage 240 are PMOS. The first and second switches SW1 (SW1-1~SW1-4), SW2 (SW2-1~SW2-4) in the control device 230 are SPDT switches that are controlled by a set of complementary control signals S, S', as shown in FIG. 2. The mirror ratios of the four sets of differential current mirrors are 21:9:6:4. The switches SW1, SW2 are selected to obtain an appropriate combination and thus the predetermined five current mirror ratios:

40=21+9+6+4

28=21+9−6+4

20=21+9−6−4

14=21−9+6−4

10=21−9−6+4

In FIG. 2, when the control signals S1, S4 are "logic 1" and the control signals S2, S3 are "logic 0", the control signals S'1, S'4 are "logic 0", and the control signals S'2, S'3 are "logic 1." This is the state of the lowest gain setting in this design.

Figure 3:
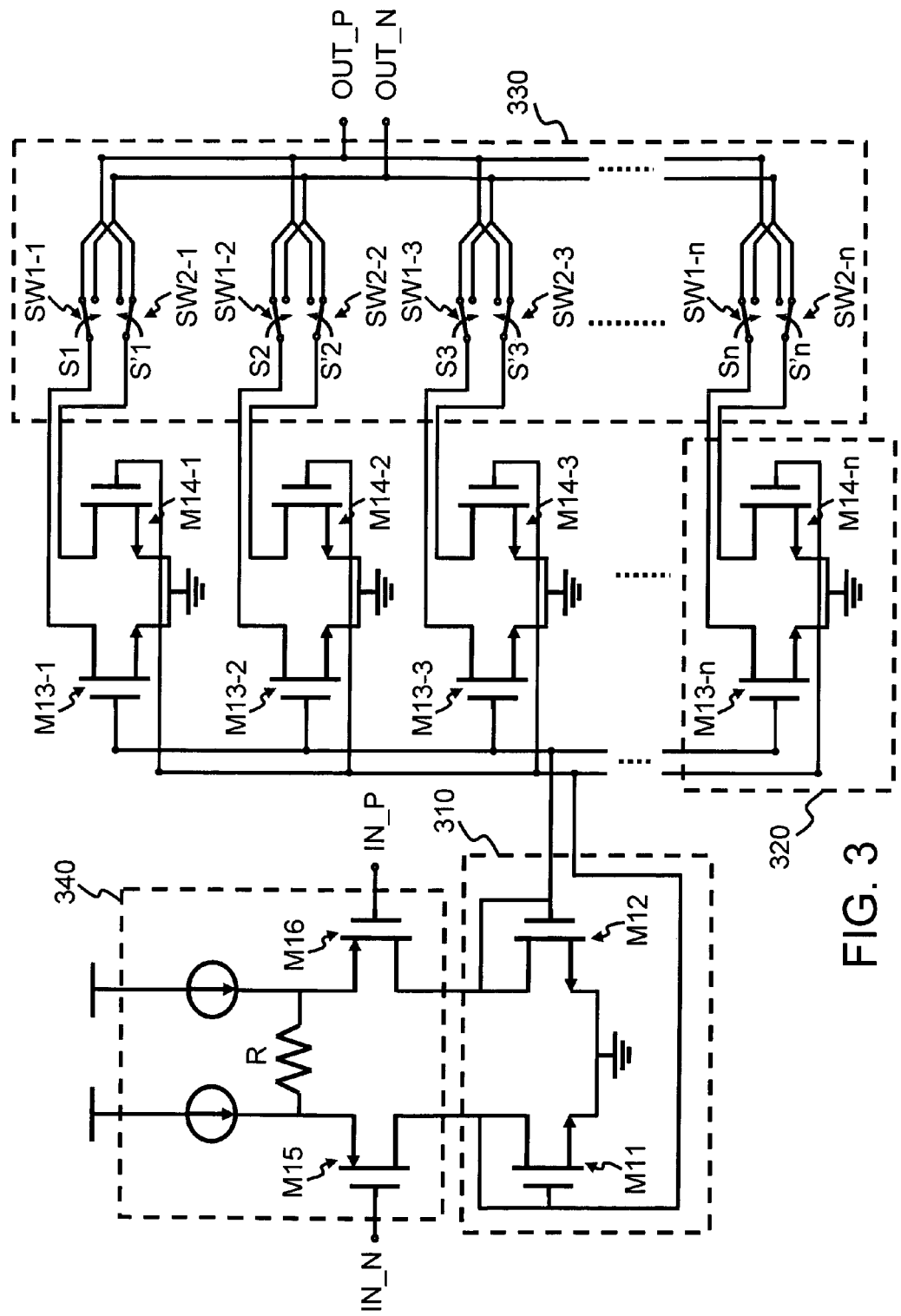
FIG. 3 is a schematic block diagram of a programmable gain current amplifier according to yet another embodiment of the invention.

Moreover, the control device can be disposed at the output terminal of each of the differential current mirrors, as shown in FIG. 3. In the drawing, the transistor pair 310 and the differential pair 320 are the same as the transistor pair 110 and the differential pair 120 in FIG. 1. We thus do not describe them again. In this embodiment, the control device 330 also includes a plurality of first switches SW1 (SW1-1~SW1-n) and a plurality of second switches SW2 (SW2-1~SW2-n). Each of the first switches SW1, SW2 and each of the differential pairs 320 form a variable polarity pseudo differential pair. Likewise, the two switches SW1, SW2 switch according to a set of complementary control signals S, S', which control the output polarities of the transistors. That is, the complementary control signals S (S1~Sn), S' (S'1~S'n) are used to select the output polarity of each of the differential current mirror.

In this case, the two switches SW1, SW2 can be SPDT switches and connected to the output terminals of the differential pairs 120. That is, terminals of the first and second switches SW1, SW2 are connected respectively to the drains of the third and fourth transistors M13, M14. The other terminals are selectively connected to two output terminals OUT_P, OUT_N. Here the control signals S,S' are a set of complementary logic numbers (i.e. "logic 0" and "logic 1"). If the control signal S is "logic 1," then the control signal S' is "logic 0." The first switch SW1 is connected to the output terminal OUT_P and the second switch SW2 is connected to the output terminal OUT_N. On the other hand, if the control signal S is "logic 0," then the control signal S' is "logic 1." In this case, the first switch SW1 is connected to the output terminal OUT_N and the second switch SW2 is connected to the output terminal OUT_P.

In this embodiment, the programmable gain current amplifier further includes: an input stage 340 to convert the input voltage into an input current, which is then provided to the transistor pair 310. Since this input stage 340 is the same as the input stage 140 in FIG. 1, we do not repeat herein.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A programmable gain current amplifier, comprising:
   a transistor pair for receiving an input current;
   a plurality of differential pairs connected with each other in parallel, wherein each of the differential pairs along with the transistor pair form a differential current mirror to amplify the input current; and
   a control device for controlling the output polarities of the differential current mirrors, amounting to a predetermined gain between the total output of the differential current mirrors and the input current.

2. The programmable gain current amplifier of claim 1, wherein mirror ratios of the differential current mirrors are determined according to predetermined programmable gain range and a predetermined gain step.

3. The programmable gain current amplifier of claim 1, wherein the control device is disposed between the transistor pair and the differential pairs.

4. The programmable gain current amplifier of claim 1, wherein the control device is disposed on the output terminals of the differential pairs.

5. The programmable gain current amplifier of claim 1, wherein the transistor pair includes a first transistor and a second transistor of substantial the same size.

6. The programmable gain current amplifier of claim 5, wherein the first and second transistors are diode-connected transistors.

7. The programmable gain current amplifier of claim 6, wherein each of the differential pairs is a pseudo differential pair, including a third transistor and a fourth transistor of substantial the same size.

8. The programmable gain current amplifier of claim 7, wherein the first to the fourth transistors are the same-type metal oxide semiconductor field effect transistors (MOSFET).

9. The programmable gain current amplifier of claim 7, wherein the first to the fourth transistors are the same-type bipolar junction transistors (BJT).

10. The programmable gain current amplifier of claim 1, wherein the control device includes a plurality of first and second switches, which control the output polarities of the differential current mirrors.

11. The programmable gain current amplifier of claim 10, wherein the first and second switches switch the output polarities of the differential current mirrors according to a set of complementary control signals.

12. The programmable gain current amplifier of claim 11, wherein the first and second switches are SPDT switches.

13. The programmable gain current amplifier of claim 1, further comprising an input stage connected to the input terminal of the transistor pair for converting an input voltage to the input current.

14. The programmable gain current amplifier of claim 13, wherein the input stage includes a differential pair with resistive degeneration.

* * * * *